United States Patent
Yamamoto

(10) Patent No.: US 8,549,742 B2
(45) Date of Patent: Oct. 8, 2013

(54) HIGH-VOLTAGE POWER SUPPLY DEVICE AND IMAGE FORMING APPARATUS HAVING SAME

(75) Inventor: Tetsuya Yamamoto, Suntou-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 602 days.

(21) Appl. No.: 12/337,534

(22) Filed: Dec. 17, 2008

(65) Prior Publication Data
US 2009/0160424 A1 Jun. 25, 2009

(30) Foreign Application Priority Data

Dec. 19, 2007 (JP) .................................. 2007-327992
Dec. 8, 2008 (JP) .................................. 2008-312494

(51) Int. Cl.
*H05K 3/32* (2006.01)
*H05K 1/18* (2006.01)

(52) U.S. Cl.
USPC .............................. 29/836; 29/846; 361/763

(58) Field of Classification Search
USPC ......... 361/760, 761, 762, 763, 764, 765, 766, 361/767; 29/832, 834, 836, 846; 399/88; 174/260; 315/209 PZ; 310/318, 316.01, 310/317; 323/248, 306
See application file for complete search history.

(56) References Cited

U.S. PATENT DOCUMENTS

| | | | | |
|---|---|---|---|---|
| 4,536,700 | A * | 8/1985 | Bello et al. | 323/285 |
| 4,939,402 | A * | 7/1990 | Hirayama et al. | 310/316.01 |
| 5,959,412 | A * | 9/1999 | Ushijima | 315/276 |
| 5,969,954 | A * | 10/1999 | Zaitsu | 363/16 |
| 6,911,786 | B2 * | 6/2005 | Qiu | 315/209 PZ |
| 7,496,278 | B2 | 2/2009 | Miyamoto et al. | |
| 7,558,501 | B2 * | 7/2009 | Saito et al. | 399/88 |
| 7,690,105 | B2 * | 4/2010 | Sedio | 29/832 |
| 2009/0044120 | A1 | 2/2009 | Miyamoto et al. | |

FOREIGN PATENT DOCUMENTS

JP 11-206113 A 7/1999

* cited by examiner

*Primary Examiner* — Gary L Laxton
(74) *Attorney, Agent, or Firm* — Fitzpatrick, Cella, Harper & Scinto

(57) ABSTRACT

A high-voltage power supply device includes a circuit board having a piezoelectric transformer; a frequency-controlled oscillator for generating a frequency signal that drives the piezoelectric transformer in accordance with a control signal; a switching element connected to a primary side of the piezoelectric transformer for performing a switching operation in accordance with the frequency signal; a capacitor and inductor forming a parallel resonance circuit for performing a resonating operation owing to switching by the switching element; and a capacitance element connected across ground and the power-supply side of the inductor. The capacitance element and the inductor are arranged on the circuit board in such a manner that when the circuit board undergoes solder-mounting, the capacitance element and the inductor are immersed in a solder bath before the piezoelectric transformer.

20 Claims, 12 Drawing Sheets

PRIOR ART

HIGH-VOLTAGE POWER SUPPLY DEVICE AND IMAGE FORMING APPARATUS HAVING SAME

BACKGROUND OF THE INVENTION

1. Field of the Invention

The present invention relates to a high-voltage output circuit using a piezoelectric transformer, a high-voltage power supply device having the high-voltage output circuit, and an image forming apparatus having this high-voltage power supply device.

2. Description of the Related Art

In recent color laser printers and the like, a plurality of photosensitive members provided for the respective colors are scanned independently by light beams from a plurality of respective optical units, thereby forming images of each of the colors. The color images are superimposed on an intermediate transfer belt and then transferred from the belt to a printing paper. Such a system is referred to as a "tandem system". Since this system forms toner images of a plurality of colors concurrently, superimposes the image on the intermediate transfer belt and then transfers the resultant color image to a printing paper, the time it takes to form the final color image can be shortened greatly.

In an electrophotographic process employed by such a color laser printer, DC voltage is used for charging bias applied to a charging roller, developing bias applied to a developer and transfer bias applied to a transfer roller. High voltage is required for these bias voltages. For example, in order to achieve good transfer in the case of transfer bias, usually a DC voltage of 3 kV or greater is required.

Conventionally, a wire-wound electromagnetic transformer is used in order to generate high voltage in a laser printer. Such an electromagnetic transformer is composed of copper wire, a bobbin and a magnetic core. In a case where a voltage of 3 kV or greater is applied using this transformer, leak current must be minimized because of a very small current the output current value of which is several microamps. For this reason, it is required that the transformer windings be molded in an insulator. This necessitates a transformer that is large in comparison with the supplied power. This is an obstacle in terms of reducing the size and weight of the high-voltage power supply device.

Accordingly, in order to achieve a reduction in the size and weight of a high-voltage power supply device, a high-voltage power supply device that generates high voltage using a thin, light-weight, high-output piezoelectric transformer (piezoelectric ceramic transformer) has started to be employed. By using a piezoelectric element made of a ceramic material as the piezoelectric transformer, it is possible to generate high voltage at an efficiency greater than that of the electromagnetic transformer. Moreover, since it is possible to increase the distance between the electrodes on the primary and secondary sides irrespective of the coupling between the primary and secondary sides, special molding work is not required for the purpose of insulation. An advantage is that the high-voltage power supply device can be reduced in size and weight, and the reduction in the size of the apparatus is great in comparison with the case where the wire-wound electromagnetic transformer is used. An example such a high-voltage power supply device using a piezoelectric transformer is disclosed in, e.g., Japanese Patent Laid-Open No. 11-206113.

FIG. 12 is a block diagram illustrating an example of a conventional high-voltage power supply device using a piezoelectric transformer. FIG. 12 illustrates an example of a circuit that outputs negative bias (negative high voltage).

Specifically, the circuit includes a piezoelectric transformer 101 for a high-voltage power supply. The output of the piezoelectric transformer 101 is rectified and smoothened to a negative voltage by diodes 102, 103 and a high-voltage capacitor 104, and the negative voltage is supplied from an output terminal 116 to a charging roller (not shown), which is the load. Further, the output voltage is potential-divided by resistors 105, 106, 107 and applied to a non-inverting input terminal (+ terminal) of an operational amplifier 109 via a protective resistor 108. A control signal Vcont, which is an analog signal for controlling the high-voltage power supply, is input via a connection terminal 118 from a controller (not shown) of a printer that accommodates this high-voltage power supply device. The control signal Vcont is applied to an inverting input terminal (− terminal) of the operational amplifier 109. An integrating circuit is constructed by the operational amplifier 109, a resistor 114 and a capacitor 113.

The output of the operational amplifier 109 is connected to a voltage-controlled oscillator (VCO) 110, and the output of the VCO 110 is connected to a FET 111 connected to an LC parallel resonance circuit formed by an inductor 112 and capacitor 115. The frequency of the signal that is output from the VCO 110 rises when the input voltage to the VCO 110 rises and falls when the input voltage falls. Accordingly, the VCO 110 outputs a signal having a frequency conforming to the level of this input voltage. The output signal of the VCO 110 drives the above-mentioned LC resonance circuit, whereby a voltage conforming to the control signal Vcont is finally supplied to the primary side of the piezoelectric transformer 101.

FIG. 13 is a diagram illustrating the driving frequency vs. output voltage characteristic of the piezoelectric transformer 101.

As illustrated in FIG. 13, the piezoelectric transformer 101 has such a characteristic that output voltage peaks at a resonance frequency f0, and it will be understood that the output voltage can be controlled based upon frequency. For example, let fx represent driving frequency at output of a stipulated output voltage Edc. The VCO 110 is such that the output frequency thereof varies in accordance with the control signal Vcont, as mentioned above. Accordingly, in a case where the piezoelectric transformer 101 is controlled so as to obtain an output voltage higher than the output voltage Edc, the output frequency of the VCO 110 is made a frequency lower than fx. In a case where the piezoelectric transformer 101 is controlled so as to obtain an output voltage lower than the output voltage Edc, the output frequency of the VCO 110 is made a frequency higher than fx. That is, the circuit depicted in FIG. 12 constructs a negative feedback control circuit in which the output voltage at the output terminal 116 is subjected to constant-voltage control in such a manner that the output becomes equal to a voltage decided by the voltage of the control signal Vcont applied to the inverting input terminal (− terminal) of the operational amplifier 109.

With the high-voltage power supply device of piezoelectric transformer type according to the prior art described above, however, a certain problem arises.

Specifically, when various components are solder-mounted automatically on a circuit board of a high-voltage power supply device of piezoelectric transformer type, an excessive voltage is produced across the terminals owing to the pyroelectric effect of the piezoelectric transformer 101 ascribable to the heat of a solder tank (solder bath). As consequence of the excessive voltage, the voltage applied to the FET 111 for driving the piezoelectric transformer 101 connected via the wiring on the board exceeds the withstand voltage of the FET, thereby destroying the FET 111.

In order to deal with this problem, the high-voltage power supply device of piezoelectric transformer type is such that when parts are solder-mounted on the board, components other than the piezoelectric transformer 101 are solder-mounted automatically using the solder tank, after which the piezoelectric transformer 101 is soldered to the board manually. However, a large number of piezoelectric transformers are mounted on the circuit board of a high-voltage power supply device used in a tandem-type color laser printer, the manual soldering process is time consuming and solder-mounting cost rises. Further, since the soldering operation is performed manually, solder-mounting errors are likely to occur and hence there are limitations in terms of improvements in yield and productivity.

SUMMARY OF THE INVENTION

As aspect of the present invention is to eliminate the above-mentioned problems encountered with the conventional technology.

The present invention provides a high-voltage output circuit that makes it possible to solder-mount a piezoelectric transformer on a board automatically, a high-voltage power supply device having this high-voltage output circuit, and an image forming apparatus that uses this high-voltage power supply device.

According to an aspect of the present invention, there is provided a high-voltage power supply device including a circuit board having a piezoelectric transformer; a frequency-controlled oscillator for generating a frequency signal that drives the piezoelectric transformer; a switching element connected to a primary side of the piezoelectric transformer for performing a switching operation in accordance with the frequency signal; and a capacitor and inductor forming a parallel resonance circuit for performing a resonating operation owing to switching by the switching element, wherein the circuit board has a capacitance element connected across ground and power-supply side of the inductor; and the capacitance element, the inductor and the piezoelectric transformer are arranged on the circuit board in such a manner that when the circuit board is soldered by a solder-mounting method, the piezoelectric transformer is solder-mounted after the capacitance element and the inductor are solder-mounted.

According to an aspect of the present invention, there is provided a high-voltage power supply device including a circuit board having a piezoelectric transformer; a frequency-controlled oscillator for generating a frequency signal that drives the piezoelectric transformer; a switching element connected to a primary side of the piezoelectric transformer for performing a switching operation in accordance with the frequency signal; and an inductor for performing a resonating operation owing to switching by the switching element, wherein the circuit board has a capacitance element connected across ground and power-supply side of the inductor; and the capacitance element, the inductor and the piezoelectric transformer are arranged on the circuit board in such a manner that when the circuit board is soldered by a solder-mounting method, the piezoelectric transformer is solder-mounted after the capacitance element and the inductor are solder-mounted.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail with reference to the accompanying drawings. It is to be understood that the following embodiments are not intended to limit the claims of the present invention, and that not all of combinations of aspects that are described according to the following embodiments are necessarily required with respect to means for solving the problems according to the present invention.

Figure 1:
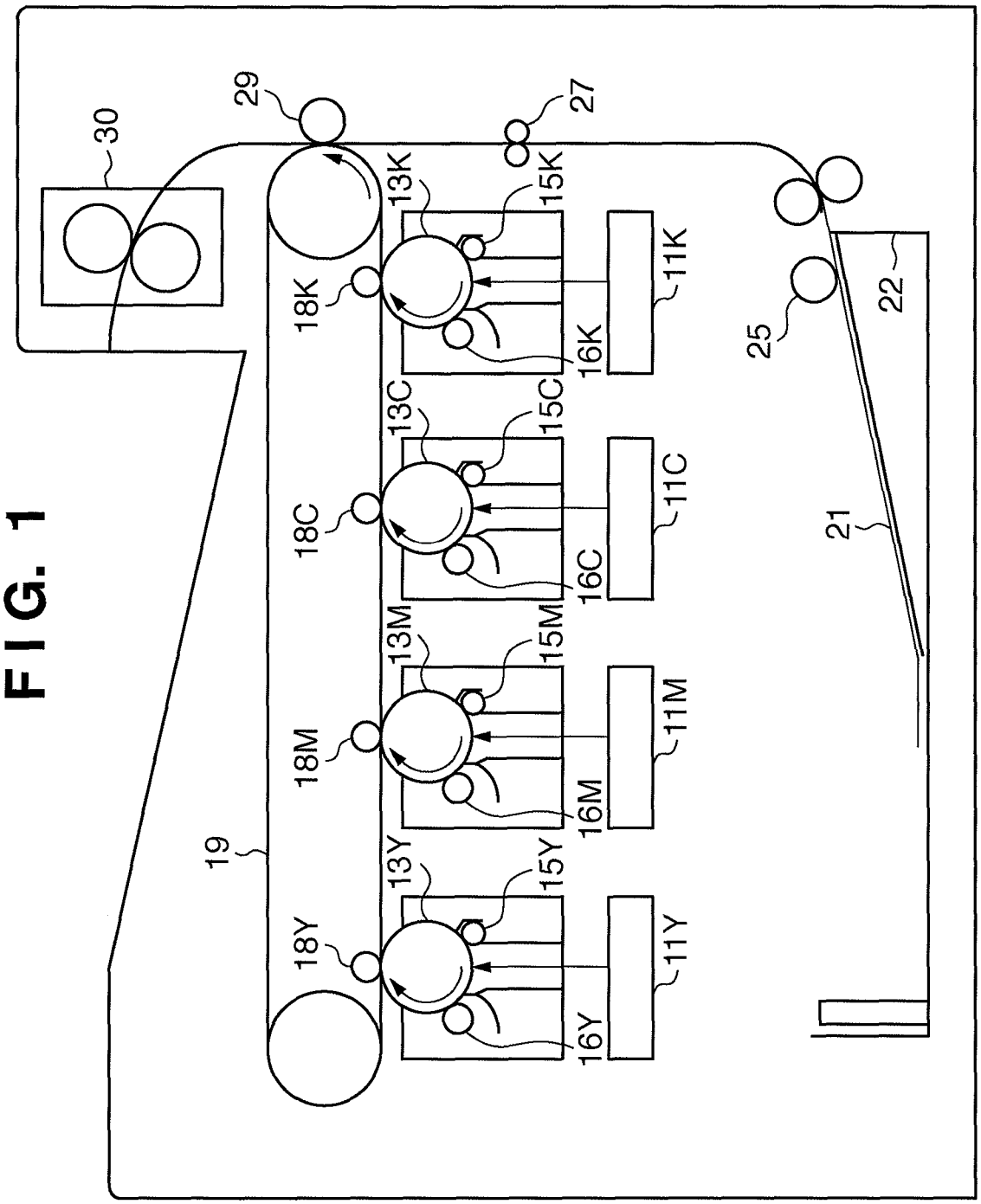
FIG. 1 is a diagram illustrating a specific example of the configuration of a tandem-type color laser printer having a high-voltage power supply device according to an exemplary embodiment of the present invention.

FIG. 1 is a diagram illustrating a specific example of the configuration of a tandem-type color laser printer having a high-voltage power supply device according to this exemplary embodiment of the present invention.

The surfaces of photosensitive drums (13Y, 13M, 13C, 13K) charged by charging bias applied to charging rollers (15Y, 15M, 15C, 15K) are irradiated with laser beams from laser scanners (11Y, 11M, 11C, 11K). As a result, electrostatic latent images corresponding to the respective colors are formed on respective ones of the photosensitive drums. The electrostatic latent images are visualized by attaching the toners of the corresponding colors by developing bias applied to developers (16Y, 16M, 16C, 16K). Next, the toners attached to the respective photosensitive drums are successively superimposed upon and transferred to an intermediate transfer belt 19 by transfer bias applied to transfer rollers (18Y, 18M, 18C, 18K), thereby forming a color toner image. It should be noted that Y, M, C and K in the Figures are symbols representing the colors yellow, magenta, cyan and black, respectively, and a charging roller, laser scanner and developer are provided for each of the colors (Y, M, C, K).

Printing paper 21 contained in a cassette 22 is fed by a paper-feed roller 25 while the transport timing thereof is adjusted in such a manner that the toner image on the intermediate transfer belt 19 will be transferred by a secondary transfer roller 29. The printing paper 21 is transported by registration rollers 27 and the color toner image on the intermediate transfer belt 19 is transferred to the printing paper 21 by the secondary transfer roller 29. The printing paper 21 carrying the color toner image is fixed by a fixing unit 30 whereby a color printout is finally obtained.

First Embodiment

A first embodiment of the present invention will be described with reference to FIGS. 2 to 8. It should be noted that the circuit diagrams illustrated in each of the following embodiments are merely examples and that the present invention is not limited to the arrangements of these embodiments.

In the first embodiment, a capacitance element (capacitor), which is for reducing a rise in voltage due to the pyroelectric effect of a piezoelectric transformer, is connected across power supply voltage Vcc and ground. Owing to the capacitor, application of excessive voltage, which is produced owing to heating of the piezoelectric transformer in a solder bath, to the components of the piezoelectric-transformer driving circuit is reduced. As a result, destruction of the components used in the piezoelectric-transformer driving circuit can be prevented. Further, parts having a large withstand voltage need not be adopted.

Figure 2:
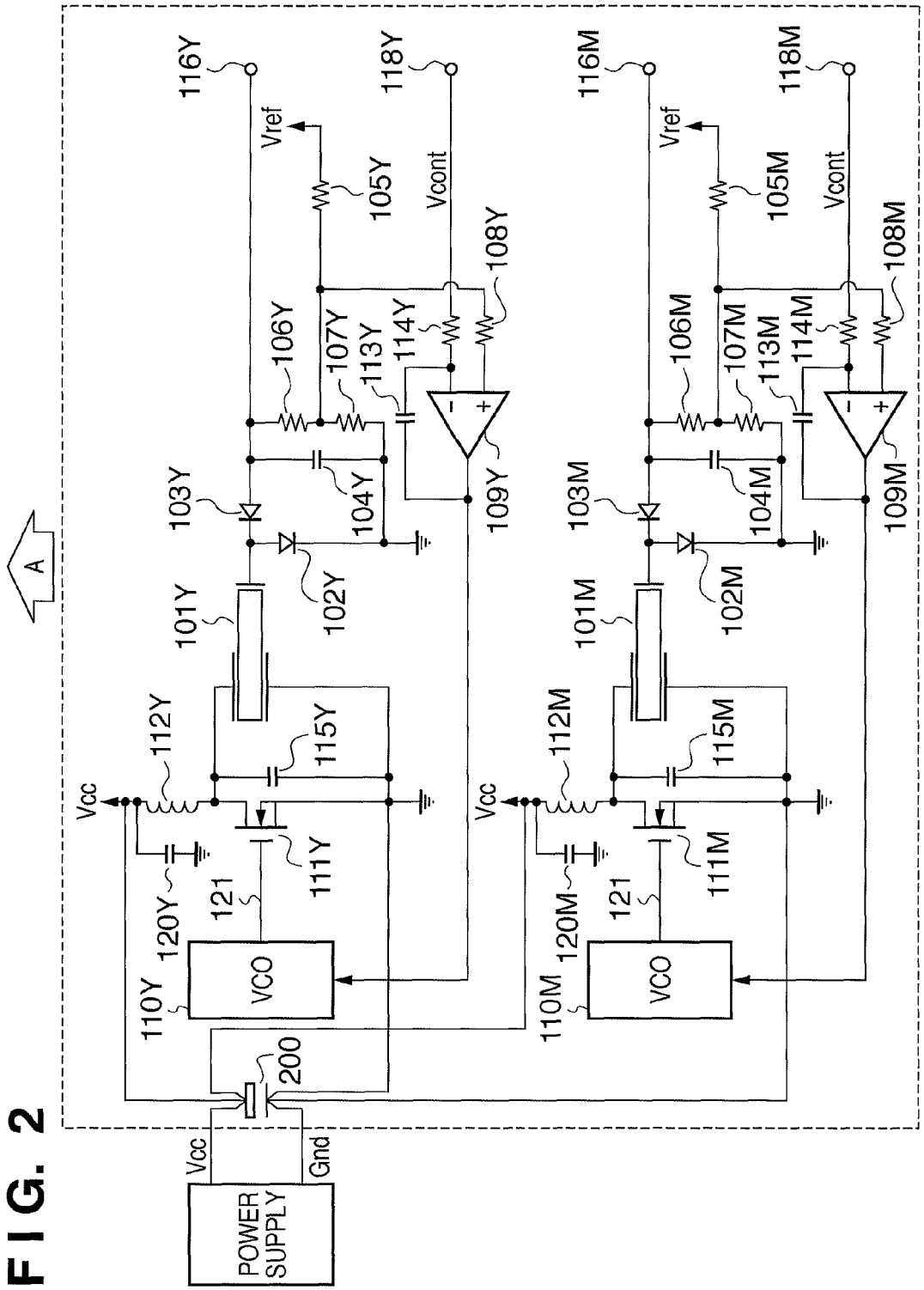
FIG. 2 is a circuit diagram illustrating the configuration of a high-voltage power supply device having a piezoelectric transformer according to a first embodiment.

FIG. 2 is a circuit diagram illustrating the configuration of the driving circuit of a piezoelectric transformer serving as a power supply circuit in a high-voltage power supply device according to the first embodiment. This will be described as an example of a high-voltage power supply device that typically outputs negative bias. It should be noted that the arrangements of the high-voltage power supply devices in each of the embodiments described below are effective for outputting either positive voltage or negative voltage. Further, the tandem-type color image forming apparatus shown in FIG. 1 can be mentioned as an example of an image forming apparatus having the high-voltage power supply device of each of the embodiments.

FIG. 2 is a circuit diagram having parallel-connected driving circuits for applying voltage to the charging roller that charges the photosensitive drum on which the yellow (Y) image is formed and to the charging roller that charges the photosensitive drum on which the magenta (M) image is formed. In FIG. 2, Y and M have been appended to the ends of the reference characters identifying the components of the driving circuits for yellow (Y) and magenta (M), respectively. It should be noted that the driving circuits are identically constructed.

Each driving circuit branches from a bypass capacitor 200. The bypass capacitor 200 provided at the branch point of a power supply is provided in order to prevent interference between frequencies when the driving circuits perform drive at different frequencies. Accordingly, the bypass capacitor 200 preferably is placed near the power supply line that branches from the power supply in each driving circuit of each color and generally is placed in the vicinity of a power supply connector (not shown).

Figure 12:
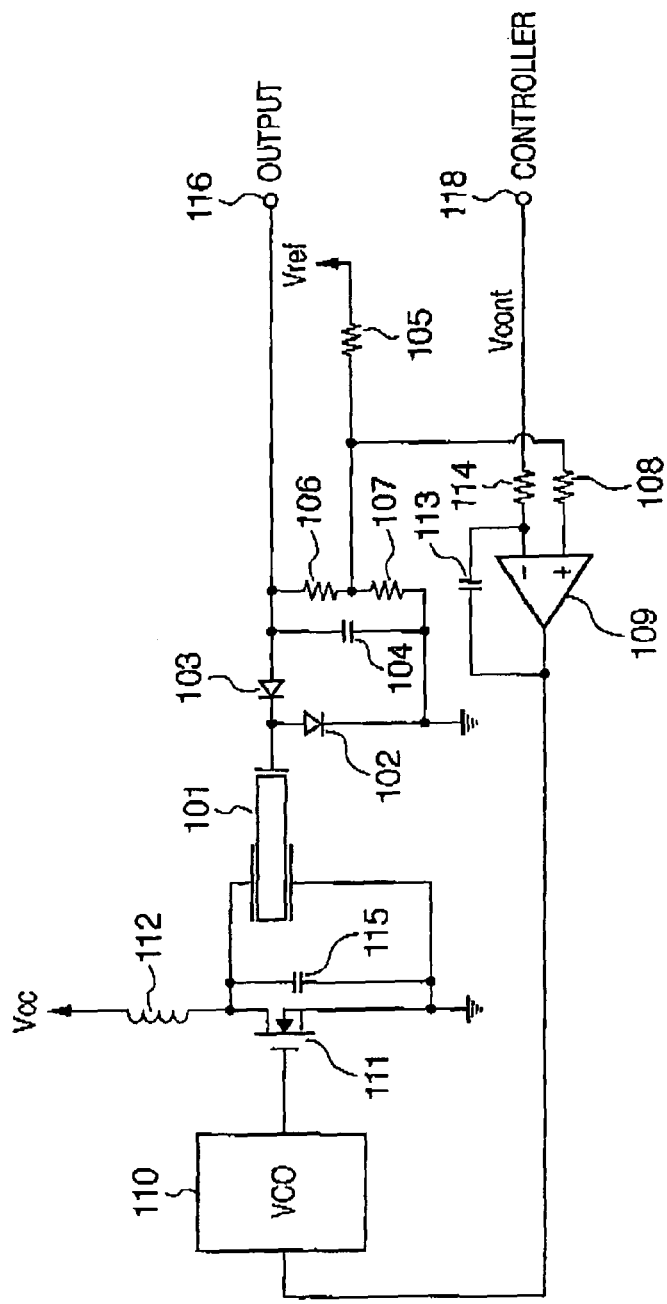
FIG. 12 is a diagram illustrating an example of a conventional high-voltage power supply circuit using a piezoelectric transformer.
Figure 13:
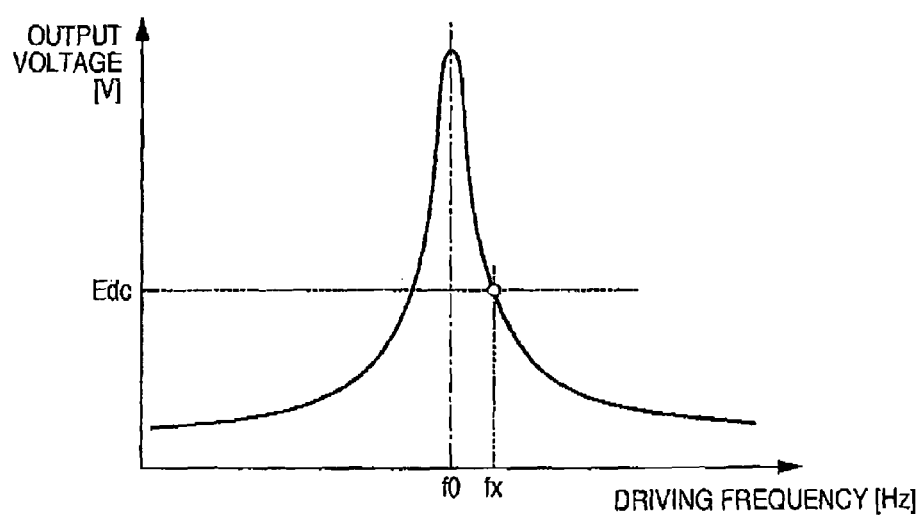
FIG. 13 is a diagram illustrating the driving frequency vs. output voltage characteristic of the piezoelectric transformer according to FIG. 12.

The configuration of the driving circuit of the high-voltage power supply device according to the embodiment shown in FIG. 2 differs from that of the prior art in FIG. 12 in that a capacitor 120Y is connected across ground and a Vcc terminal on the power supply side of an inductor 112Y. Furthermore, unlike the bypass capacitor 200, the capacitor 120Y (120M) is placed in each of the driving circuits in the manner illustrated. With regard to control of the piezoelectric transformer 101 (101Y, 101M), operation is similar to that described above with reference to FIG. 12. Accordingly, components similar to those shown in FIG. 12 are designated by like reference characters and need not be described again.

Figure 3:
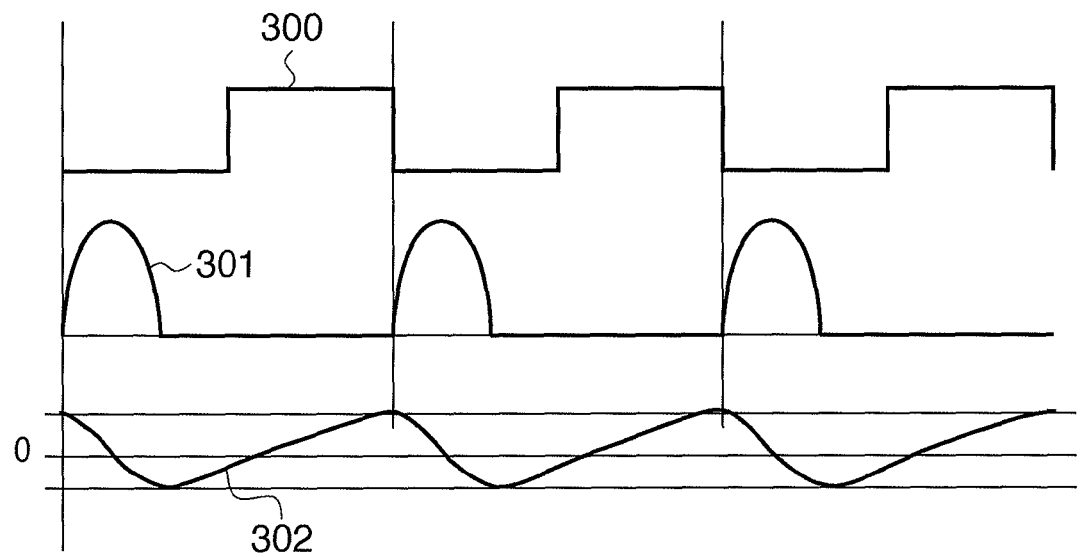
FIG. 3 is a waveform diagram illustrating operation waveforms of various portions of the high-voltage power supply device using the piezoelectric transformer according to the first embodiment.

Next, reference will be had to FIG. 3 to describe operation of the piezoelectric-transformer driving circuit according to the first embodiment.

FIG. 3 is a waveform diagram illustrating operation waveforms of various portions of the high-voltage power supply device using the piezoelectric transformer according to the first embodiment.

FIG. 3 illustrates a voltage waveform 300 of a signal 121 (FIG. 2) applied to the gate of the FET (switching element) 111 (111Y, 111M), a voltage waveform 301 that appears at the drain of the FET 111, and current 302 that flows into the inductor 112 (112Y, 112M).

When the voltage 300 exceeds the threshold voltage of the gate of FET 111 and the FET 111 turns on, current flows into the inductor 112 and the energy of the inductor 112 is stored. Next, when the voltage 300 drops and FET 111 turns off, resonance is produced between the inductor 112 and capacitor 115, as indicated at 301. The FET 111 is driven in such a manner that the ON interval of the FET 111 starts when the resonance voltage is 0 V. As a result, resonance is repeated continuously in an efficient manner.

Also illustrated in FIG. 3 is a current waveform 302 of current that flows into the inductor 112 during the resonating operation. If the FET 111 turns on, current flows into the FET 111 through the inductor 112. Then, when the FET 111 is turned off, current continues to flow so as to charge the capacitor 115 by the inductive action of the inductor 112. Furthermore, after the current that flows into the inductor 112 becomes zero and the voltage that appears at the drain of FET 111 peaks, a current regenerating operation begins instead. As a result, current flows to the side of the power supply Vcc from the capacitor 115 and from a regenerative diode (not shown) within the FET 111. Thus, a voltage boosted sufficiently by the above-described resonating operation is applied to the piezoelectric transformer 101, oscillation is produced and a high voltage is generated on the secondary side.

Described next will be the pyroelectric effect at the time of solder-mounting of the power supply circuit board in the high-voltage power supply device shown in FIG. 2. The arrow A in FIG. 2 indicates the direction of conveyance when the board that includes the power supply circuit enclosed by the dashed line is automatically solder-mounted. Although a power supply circuit arrangement having two driving circuits is illustrated in FIG. 2, the number of driving circuits is not limited to two. The driving circuits can be provided in a number conforming to the number of required voltage outputs and can be placed on a single board. Further, circuits other than the driving circuits can be placed on the same board as that on which the driving circuits are solder-mounted.

The high-voltage power supply device having the piezoelectric transformer 101 and the driving circuit thereof is introduced into a solder bath when components are automatically solder-mounted on the circuit board. At this time the piezoelectric transformer 101 is subjected to heat and the polarization balance of the piezoelectric-transformer surface is disturbed. Owing to this disturbance of polarization balance, a pyroelectric charge Qconst is produced across the terminals on the primary side of the piezoelectric transformer 101. The pyroelectric charge Qconst is an amount of charge that depends upon the length and thickness of the piezoelectric transformer 101 and differs depending upon the shape of the piezoelectric transformer 101. The pyroelectric charge Qconst can be found from Qconst=C0×V0, where V0 represents generated voltage obtained when the piezoelectric transformer alone is subjected to heat equivalent to the temperature profile of the solder bath, and C0 represents parasitic capacitance on the primary side of the piezoelectric transformer 101.

Reference will be had to FIGS. 4 to 7 to describe a rise in voltage produced across the terminals of the piezoelectric transformer 101 when it is passed through the solder bath.

Figure 4:
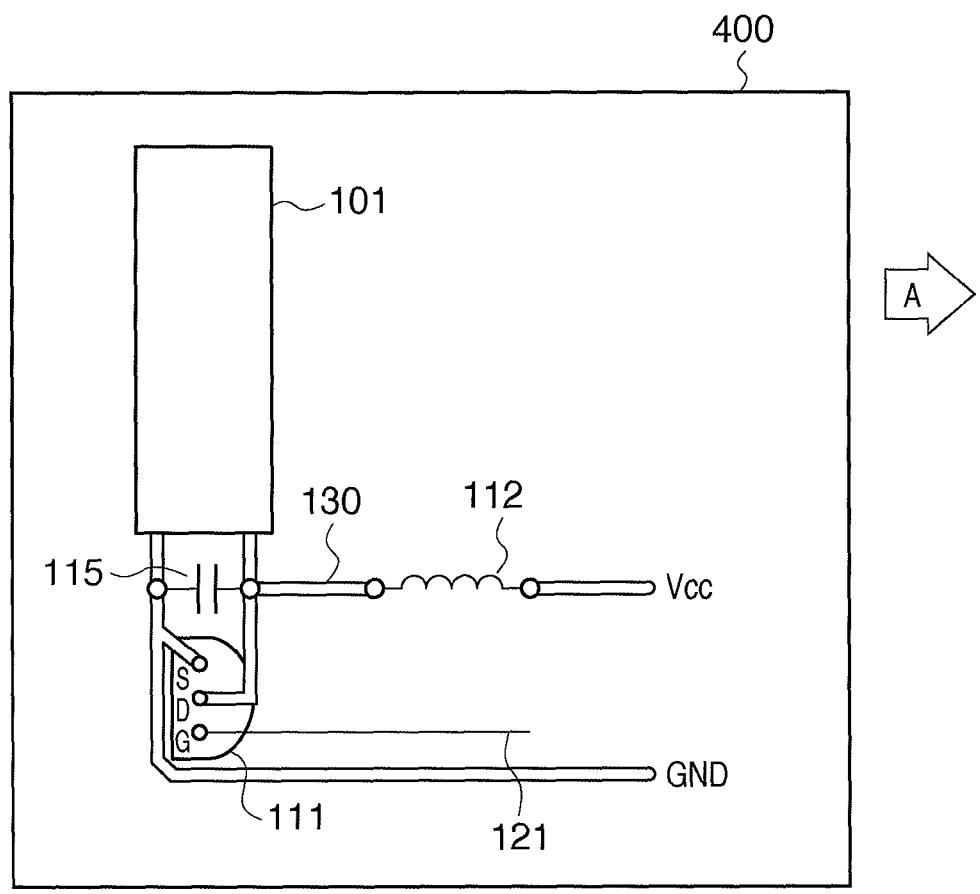
FIG. 4 is a diagram illustrating a specific example of the arrangement of a piezoelectric transformer, resonance capacitor, resonance inductor and switching FET on a board of a conventional high-voltage power supply device.
Figure 5:
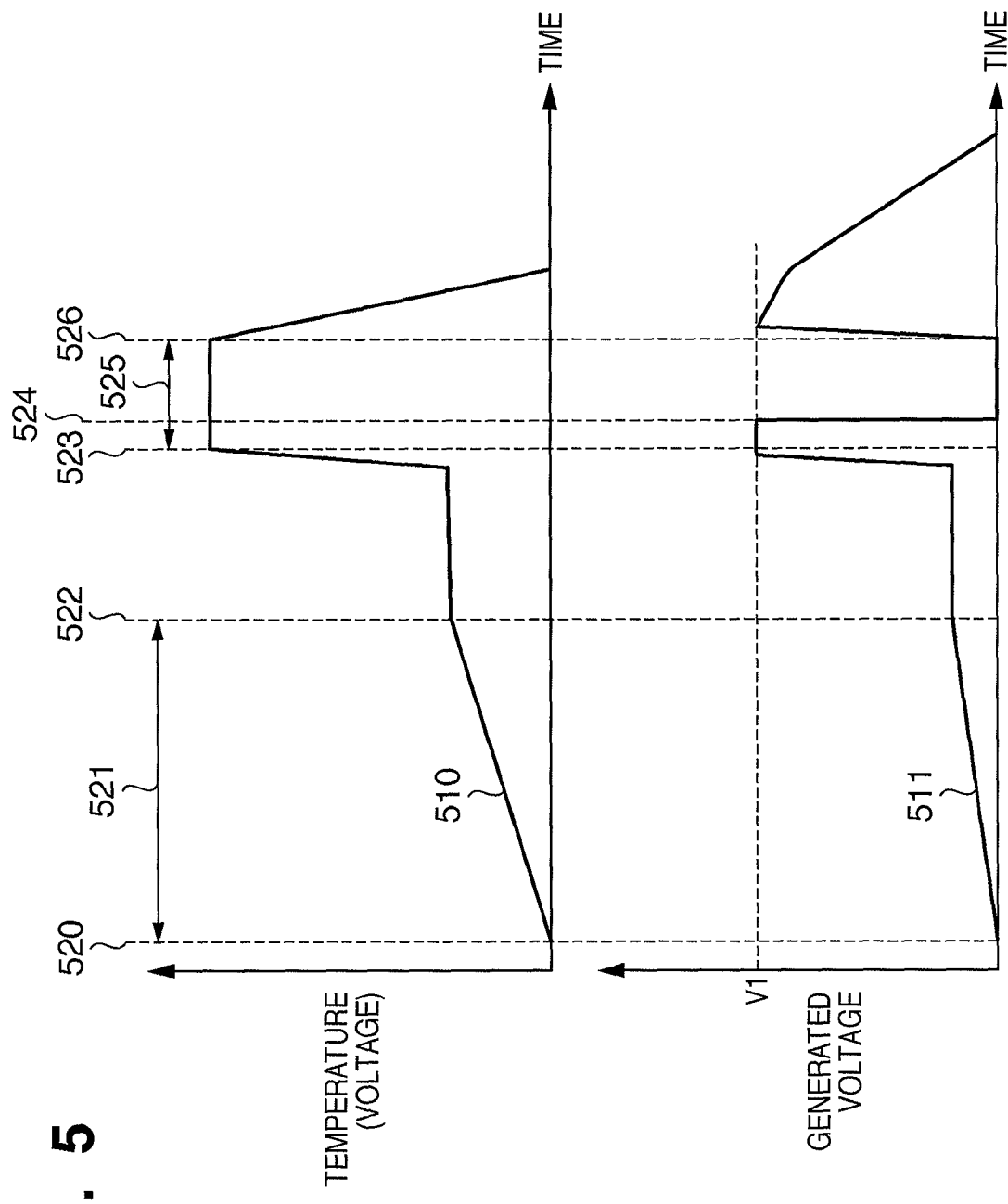
FIG. 5 is a diagram useful in describing a rise in temperature and rise in voltage of a piezoelectric transformer in a case where the board shown in FIG. 4 is solder-mounted automatically by a solder tank.

FIGS. 4 and 5 are diagrams relating to the prior art for describing, by means of contrast, effects based upon the configuration of the first embodiment. The description relates to the case of the conventional high-voltage power supply device (FIG. 12) not provided with the capacitor 120 of FIG. 2.

FIG. 4 is a diagram illustrating a specific example in which the piezoelectric transformer 101, resonance capacitor 115, resonance inductor 112 and FET 111 have been arranged on a board 400. The board 400 is conveyed in the direction of arrow A, introduced into a solder bath and lowered into the solder bath so that the board contacts the molten solder from below.

FIG. 5 is a diagram useful in describing a rise in temperature and rise in voltage of a piezoelectric transformer in a case where the board 400 shown in FIG. 4 is solder-mounted automatically using a solder bath.

A curve 510 in FIG. 5 represents a rise in temperature at a terminal on the primary side of the piezoelectric transformer 101 with respect to the horizontal time axis. A curve 511 represents a rise in voltage at a terminal on the primary side of the piezoelectric transformer 101, and the time axis coincides with that of the temperature rise 510 of the primary-side terminal.

The board 400 is conveyed along the time axis to the solder bath. First, the board 400 is introduced to a preheating step 521 at timing 520. The preheating step 521 precedes the immersion of the board 400 into the solder bath. In this step 521, the board 400 is raised to a high temperature gradually in order to prevent a sudden change in the temperature of the board 400 and components mounted on the board. As a result of the preheating step 521, a voltage is gradually produced across the primary terminals of the piezoelectric transformer 101, as indicated by curve 510. Next, at timing 522, the preheating step ends and the board 400 is introduced to the solder bath. Then, at timing 523, the piezoelectric transformer 101 is immersed into the solder bath. At this time the temperature of the piezoelectric transformer 101 peaks and the maximum charge Qconst is produced across both primary terminals of the piezoelectric transformer 101.

The voltage produced at the primary-side terminal of the piezoelectric transformer 101 is applied directly to wiring 130 shown in FIG. 4 owing to the fact that the primary-side terminal is contacted with a copper foil pattern at a land or through-hole as by clinching. The voltage produced at the primary-side terminal of the piezoelectric transformer 101 and wiring 130 is indicated at 511 in FIG. 5.

The capacitor 115 for resonating drive is connected to the wiring 130. Voltage V1 produced in the wiring 130 is represented by Equation (1) below, where C0 represents parasitic capacitance on the primary side of the piezoelectric transformer 101, Qconst the generated charge at the primary-side terminal of the piezoelectric transformer 101 and C1 the capacitance of the capacitor 115.

$$V1 = Qconst/(C1+C0) \quad \text{Eq. (1)}$$

Next, the voltage V1 produced in the wiring 130 is held as is until the other primary-side terminal of the piezoelectric transformer 101 is immersed into the solder bath at timing 524. Then, at timing 524, this other primary-side terminal of the piezoelectric transformer 101 is immersed into the solder bath, whereby both terminals on the primary side of the piezoelectric transformer 101 are shorted and the potential V1 across the terminals becomes zero.

Upon elapse of interval 525 in which the piezoelectric transformer 101 remains immersed in the solder bath, the board 400 is raised from the solder bath at timing 526, whereupon the two terminals are removed from the shorted state. At this time a voltage is produced at the primary terminals of the piezoelectric transformer 101. This voltage declines gradually as the piezoelectric transformer 101 cools.

In the process described above, the voltage V1 produced in the wiring 130 is applied across the source and drain of the FET 111. The voltage V1 is less than the pyroelectric voltage V0 produced in the piezoelectric transformer 101 alone owing to the capacitance C1 of the capacitor 115. However, the capacitor 115 is provided for the resonance operation and the capacitance C1 thereof has a value on the order of several hundred picofarads. This does not lower voltage sufficiently. As a consequence, the voltage V1 becomes a high voltage and exceeds the withstand voltage across the drain and source of FET 111, as a result of which the FET 111 may be destroyed.

Figure 6:
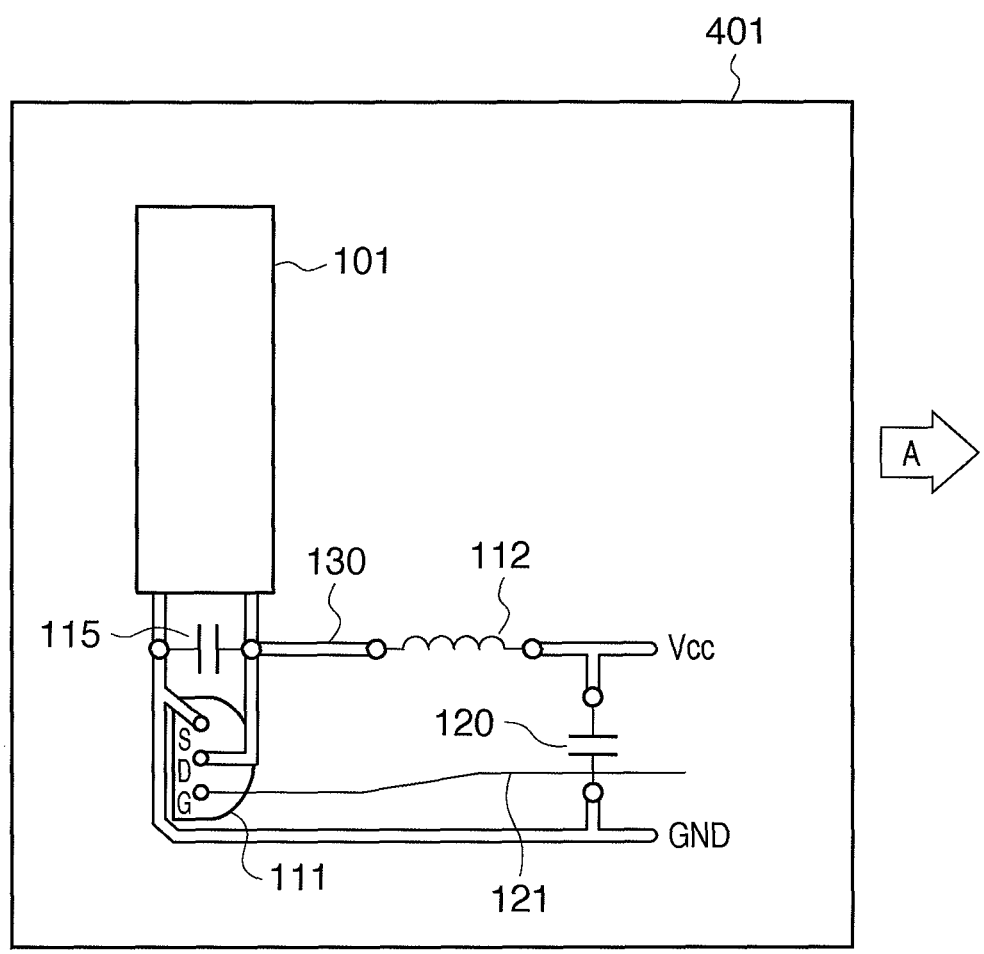
FIG. 6 is a diagram illustrating a specific example of the arrangement of a piezoelectric transformer, resonance capacitor, resonance inductor and switching FET on a board of the high-voltage power supply device according to the first embodiment.
Figure 7:
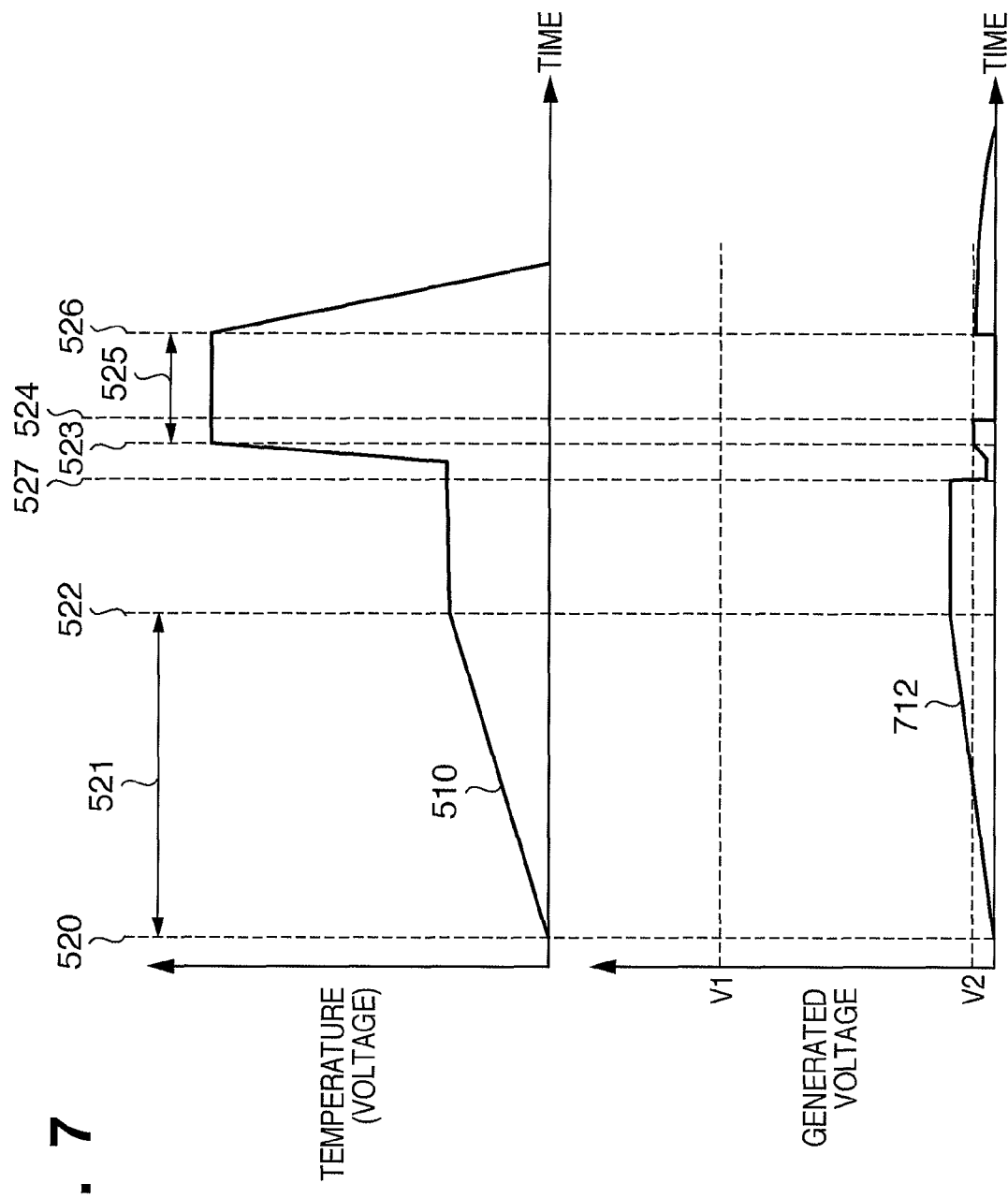
FIG. 7 is a diagram useful in describing a rise in temperature and rise in voltage of a piezoelectric transformer when the board of FIG. 6 is transported in the direction of the arrow and is introduced from preheating to an automatic solder-mounting process that uses a solder bath.

Next, reference will be had to FIGS. 6 and 7 to describe the circuit configuration and effects of the high-voltage power supply device according to the first embodiment. A characterizing feature of the high-voltage power supply device according to the first embodiment is the existence of the capacitor 120 described above with reference to FIG. 2. The capacitor 120 has been inserted between ground and the power supply line of the inductor 112. A further characterizing feature is that capacitance C2 of the capacitor 120 has a sufficiently large value with respect to the parasitic capacitance C0 on the primary side of the piezoelectric transformer 101.

FIG. 6 is a diagram illustrating an example in which the piezoelectric transformer 101, resonance capacitor 115, resonance inductor 112 and switching FET 111 have been arranged on a board 401 of the driving circuit of the high-voltage power supply device according to the first embodiment of the present invention.

It should be noted that the piezoelectric transformer 101 (101Y, 101M), resonance capacitor 115 (115Y, 115M), resonance inductor 112 (112Y, 112M) and FET 111 (111Y, 111M) are the same as those shown in the arrangement of FIG. 2.

FIG. 7 is a diagram useful in describing a rise in temperature and rise in voltage of a piezoelectric transformer when the board 401 in FIG. 6 is conveyed in the direction of arrow A and is introduced from a preheating step to an automatic solder-mounting. In a manner similar to that in FIG. 5 described above, the voltage produced at the primary-side terminal of the piezoelectric transformer 101 is applied to wiring 130 shown in FIG. 7 owing to the fact that the terminal is contacted with a copper foil pattern at a land or through-hole as by clinching. Components in FIG. 7 similar to those shown in FIG. 5 are designated by like reference characters.

The voltage produced at the primary-side terminal of the piezoelectric transformer 101 and wiring 130 is indicated at 712. In the preheating step 521, a voltage similar to that shown in FIG. 5 is produced in the piezoelectric transformer 101 during this period of time. Next, the board 401 is conveyed to the solder bath. Before the piezoelectric transformer 101 contacts the solder in the solder bath at timing 523, the capacitor 120 and inductor 112 are immersed into the solder bath at timing 527, whereby they are connected to the copper foil pattern. At this timing 527, a path along which the electric charge produced at the primary terminals of the piezoelectric transformer 101 charges the capacitor 120 via the inductor 112 is established. As a result, the voltage produced in the wiring 130 declines.

Accordingly, when the piezoelectric transformer 101 is immersed in the solder bath at timing 523, the voltage V2 that rises owing to the pyroelectric effect is represented by Equation (2) below, where C2 represents the capacitance of the capacitor 120Y.

$$V2 = Qconst/(C2+C1+C0) \quad \text{Eq. (2)}$$

Thus, the voltage V2 is applied to the FET 111. Here it is required that the voltage V2 be made less than maximum rated voltage Vdss across the drain and source of FET 111. That is, it is required that the capacitance C2 of the capacitor 120 satisfy the following condition:

$$C2 > (Qconst/Vdss) - C1 - C0 \quad \text{Eq. (3)}$$

In general, this is represented by $C2 > (Q/V) - C1 - C0$.

If the capacitance C2 of capacitor 120 satisfies this condition, the voltage V2 that rises owing to the pyroelectric effect will fall below the maximum rated voltage across the drain and source of FET 111.

As will be evident from a comparison of FIGS. 5 and 7, the high-voltage power supply device according to the first embodiment is such that the voltage V2 produced at the primary windings of the piezoelectric transformer 101 declines by a much wider margin in comparison with the above-mentioned voltage V1. As a result, it is possible to prevent destruction of components in the driving circuit at the time of automatic solder-mounting of the FET 111 using the solder bath.

It should be noted that in the arrangement described in FIG. 6, the focus is on only the maximum rated voltage across the source and drain of FET 111.

Figure 8:
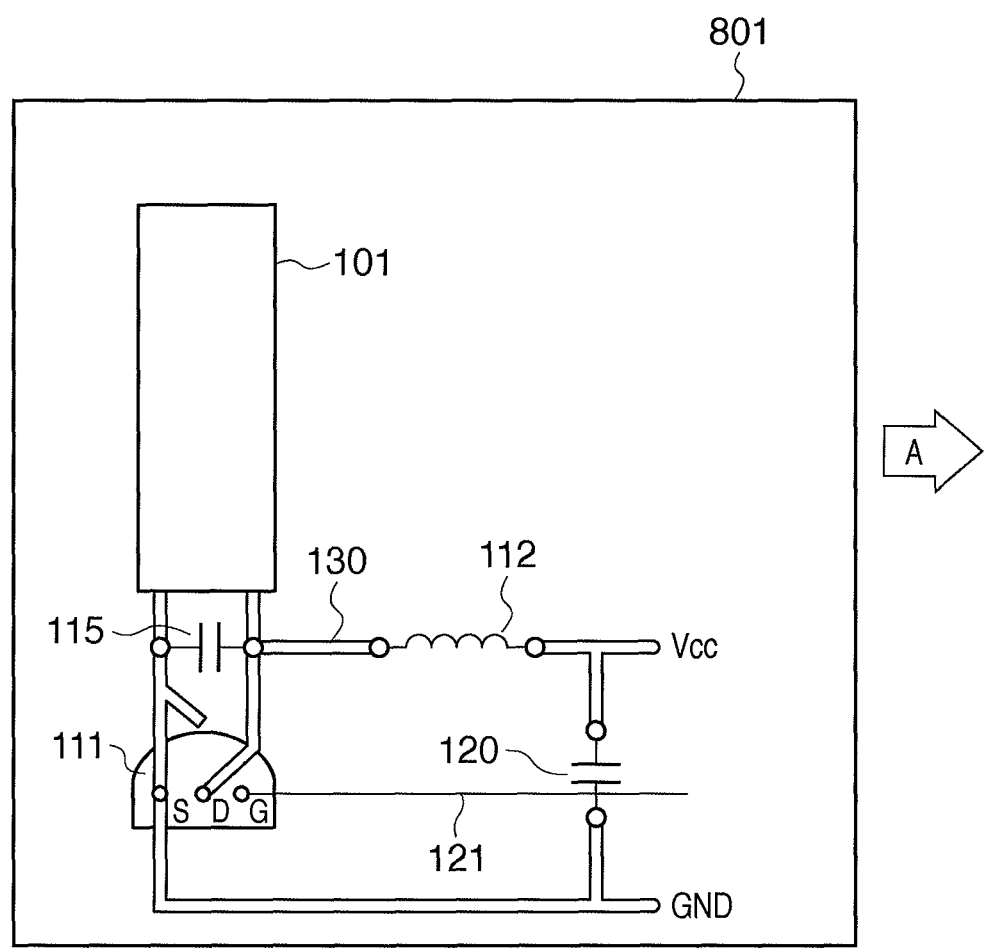
FIG. 8 is a diagram illustrating another specific example of the arrangement of a piezoelectric transformer, resonance capacitor, resonance inductor and switching FET on a board of the high-voltage power supply device according to the first embodiment.

FIG. 8 is a diagram illustrating an example in which the piezoelectric transformer 101, resonance capacitor 115, resonance inductor 112 and switching FET 111 have been arranged on a board 801 of the driving circuit of the high-voltage power supply device according to the first embodiment of the present invention. Components in FIG. 8 similar to those shown in FIG. 6 are designated by like reference characters.

In the case of the arrangement shown in FIG. 8, the gate and drain of FET 111 are shorted first in the process of introduction into the solder bath. In this case, the voltage V2 that rises owing to the pyroelectric effect is impressed across the gate and source of FET 111. In order to prevent destruction of the FET 111, therefore, it is required that the voltage V2 be made less than the maximum rated voltage Vgss across the gate and source of FET 111. That is, it is required that the capacitance C2 of the capacitor 120 satisfy the following condition:

$$C2 > (Qconst/Vgss) - C1 - C0 \quad \text{Eq. (4)}$$

By adopting this arrangement, the voltage V2 that rises owing to the pyroelectric effect falls below the maximum rated voltage across the drain and source of FET 111 and it is possible to prevent destruction of the FET 111 at the time of automatic solder-mounting using the solder bath.

Next, the capacitance C2 of capacitor 120 will be described with reference to specific numeral values.

Assume that 900 V is the voltage generated by the piezoelectric transformer 101 alone at a temperature of approximately 260° C. during automatic solder-mounting using the solder bath. Further, let the parasitic capacitance on the primary side of the piezoelectric transformer 101, the capacitance of the resonance capacitor 115 and the maximum rated voltage across the gate and source and FET 111 be 500 pF, 470 pF and 30 V, respectively. It is required that the capacitance C2 of the capacitor 120 satisfy the following condition:

$$C2 > (Qconst/Vgss) - C1 - C0 > (900\,V \times 500\,pF/30) - 470\,pF - 500\,pF > 0.014\,\mu F \quad \text{Eq. (5)}$$

It will be understood from this discussion that the capacitance of capacitor 120 is required to be greater than 0.014 μF in order to prevent destruction of the FET 111.

As described above, the driving circuit of the high-voltage power supply device according to the first embodiment includes the piezoelectric transformer 101, the voltage-controlled oscillator 110 and the FET 111 switchingly driven in accordance with the frequency of the frequency signal that is output from the voltage-controlled oscillator 110. The circuit further includes the capacitor 115 and inductor 112 forming a parallel resonance circuit so as to resonate owing to the switching operation of the FET 111, and the capacitor 120, which is for reducing the pyroelectric voltage, connected across ground and the terminal on the side of the power supply connected to the inductor 112. The capacitor 120 and inductor 112 are placed on the board in such a manner that they will be immersed in the automatic solder-mounting before the piezoelectric transformer 101 at the time of automatic solder-mounting of the piezoelectric transformer 101 using the solder bath. As a result, it is possible to reduce a rise in voltage due to the pyroelectric effect of the piezoelectric transformer 101 that occurs at the time of automatic solder-mounting using the solder bath.

Furthermore, in the first embodiment, the capacitance of the capacitor 120 is set to a value that makes it possible to select a capacitor and switching element best suited for the power supply device. As a result, automatic solder-mounting using the solder bath is possible to carry out while reliably preventing destruction of the FET serving as the switching element.

As a result, an operation such as manual soldering of the piezoelectric transformer is unnecessary. This has the effect of lowering solder-mounting cost and improving reliability of components after automatic solder-mounting using a solder bath.

It should be noted that the circuit elements (components) illustrated in FIGS. 6 and 8 according to the first embodiment are merely examples and that the present invention is not limited to these elements. However, the fact that the capacitor 120 and inductor 112 are solder-mounted on the board, which undergoes automatic solder-mounting using a solder bath, in such a manner that they are immersed in the solder-mounting before the piezoelectric transformer 101, is an important structural requisite of this embodiment.

Second Embodiment

A second embodiment of the present invention will now be described.

Figure 9:
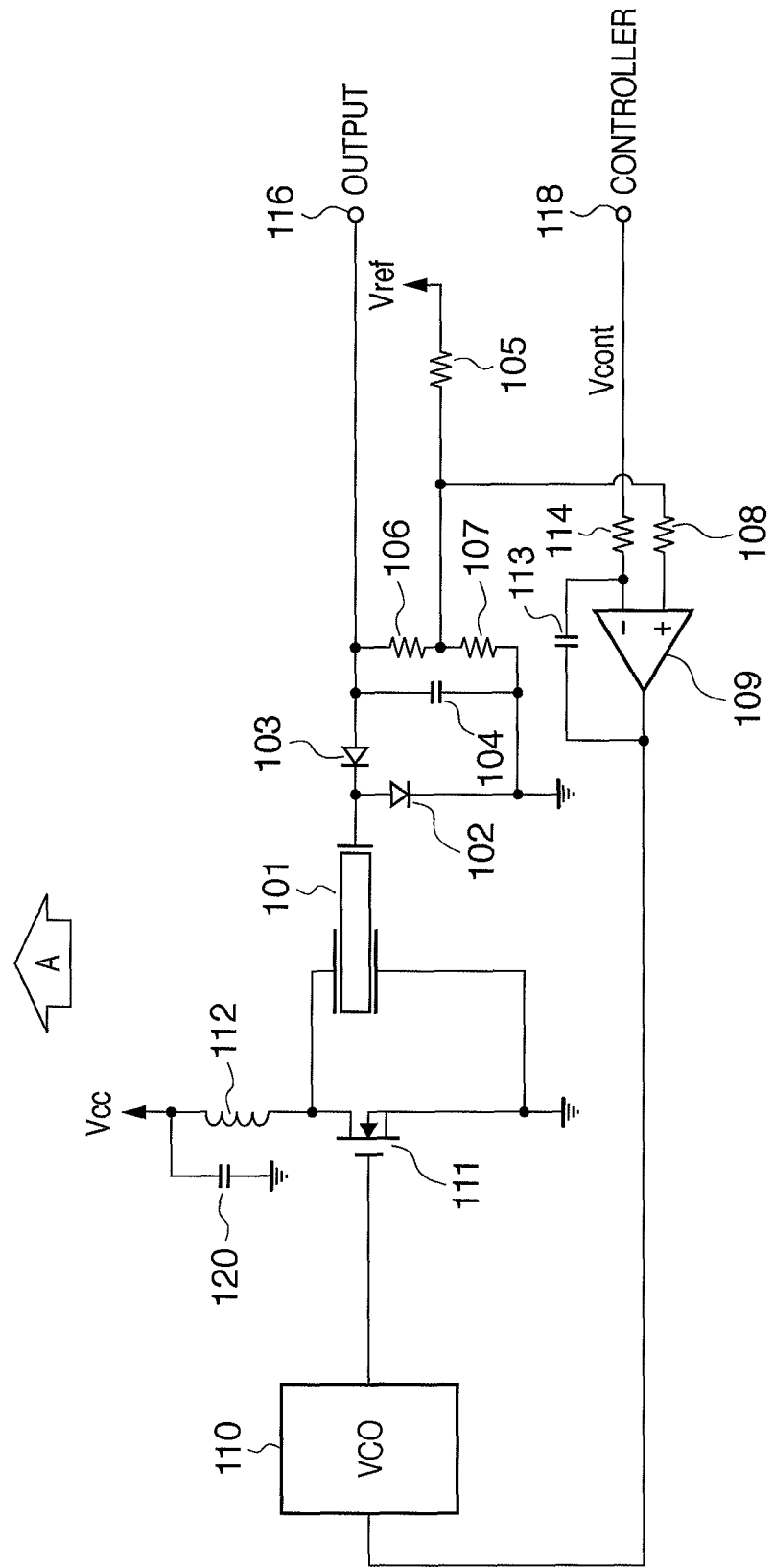
FIG. 9 is a block diagram illustrating the configuration of a high-voltage power supply device according to a second embodiment of the present invention.

FIG. 2 is a diagram useful in describing the configuration of the driving circuit of a piezoelectric transformer in a high-voltage power supply device according to the second embodiment. Components in FIG. 9 identical with those shown in FIG. 2 are designated by like reference characters and need not be described again.

If compared with the driving circuit of the high-voltage power supply device according to the first embodiment, it will be understood that this embodiment does not have the capacitor 115 for parallel resonance shown in FIG. 2. Accordingly, the parasitic capacitance of the piezoelectric transformer 101 is used instead of the resonance capacitor to obtain the resonance circuit. In the case of this arrangement, components are placed on a circuit board 1001 as shown in FIG. 10 and the capacitance C2 of the capacitor 120 is decided according to Equation (5) below.

$$C2 > (Qconst/Vgss) - C0 \quad \text{Eq. (5)}$$

Figure 10:
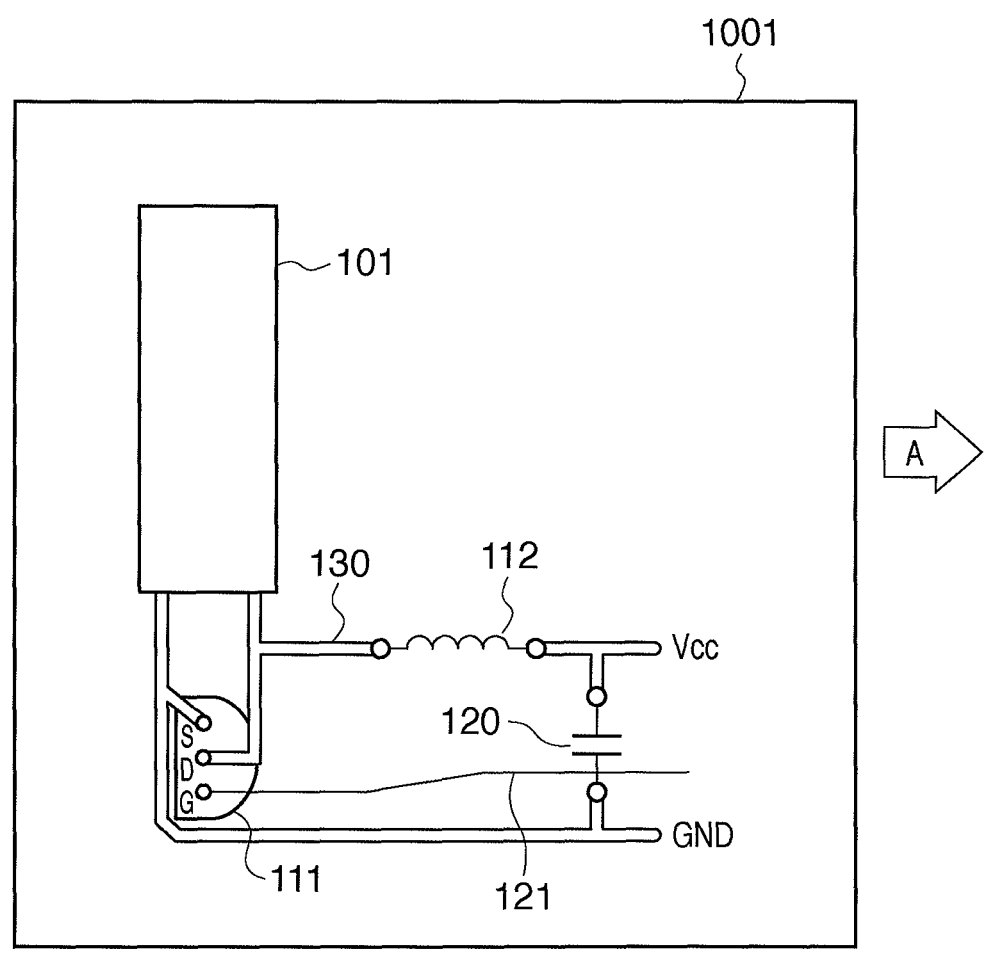
FIG. 10 is a diagram illustrating a specific example of the arrangement of a piezoelectric transformer, resonance capacitor, resonance inductor and switching FET on a board of the high-voltage power supply device according to the second embodiment.

FIG. 10 is a diagram illustrating a specific example in which the piezoelectric transformer, resonance capacitor, resonance inductor and switching FET have been arranged on the board of the driving circuit of the high-voltage power supply device according to the second embodiment. Components in FIG. 10 identical with those shown in FIG. 6 are designated by like reference characters.

The capacitor 120 having the capacitance calculated according to Equation (5) above is connected across power supply Vcc and ground. As a result, the capacitor 120 and inductor 112 are immersed into the solder-mounting before the piezoelectric transformer 101, as illustrated in FIG. 10, at the time of automatic solder-mounting using the solder bath.

Specifically, in a manner similar to the case of FIG. 6 described above, the capacitor 120 and inductor 112 are immersed into the solder bath and are connected to a copper foil pattern. As a result, a path along which the electric charge produced at the primary terminals of the piezoelectric transformer 101 charges the capacitor 120 via the inductor 112 is established. Voltage produced in the wiring 130 thus declines.

In accordance with the second embodiment, as described above, it is possible to select a capacitance element that takes into consideration the withstand voltage of the driving circuit components of the piezoelectric transformer in which use is made of a switching element, which is a semiconductor element such as a FET. As a result, automatic solder-mounting using a solder bath is possible to carry out while reliably preventing destruction of the components used. This means that it is possible to prevent destruction of components such as the FET at the time of automatic solder-mounting using the solder bath.

Third Embodiment

A third embodiment of the present invention will now be described. This embodiment differs from the first embodiment in that a board 1101 is subjected to reflow soldering.

Figure 11:
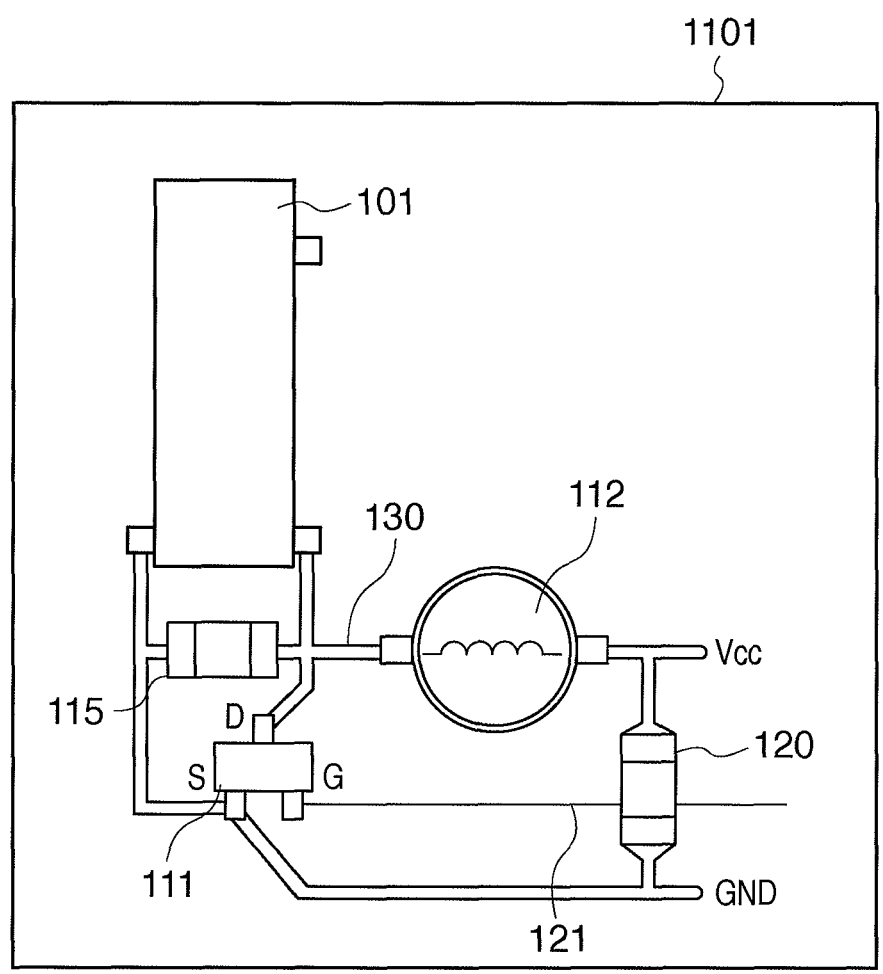
FIG. 11 is a diagram useful in describing a board of a high-voltage power supply device according to a third embodiment of the present invention, wherein the board is composed entirely of surface-mounted elements.

FIG. 11 is a diagram useful in describing a board on which the components of a piezoelectric-transformer driving circuit have been placed, the components being entirely surface-mounted elements. The reference characters in FIG. 11 correspond to like reference characters shown in FIG. 2 described in the first embodiment.

In the case of reflow soldering, the terminals of components mounted on board 1101 ahead of time by a cream solder are in a state in which they have been connected via respective print patterns. Accordingly, the layout shown in FIG. 11 of the third embodiment is not an important structural requisite of the present invention and is merely one example for the purpose of description.

Further, unlike the first embodiment, the drain and gate of FET 111 are not placed in a state in which they are shorted by solder. When the capacitance of capacitor 120 is decided, therefore, it will suffice to take into consideration only the maximum rated voltage Vdss across the drain and source of the FET 111. That is, the capacitance value C2 of the capacitor 120 is made a value that satisfies Equation (6) below, where Qconst represents the amount of charge generated across the primary terminals of the piezoelectric transformer 101, C0 the parasitic capacitance on the primary side of the piezoelectric transformer 101 and C1 the capacitance of the resonance drive capacitor 115.

$$C2 > (Qconst/Vdss) - C1 - C0 \quad \text{Eq. (6)}$$

As a result, voltage produced by the pyroelectric effect of the piezoelectric transformer 101 at the time of reflow soldering falls below the maximum rated voltage of the FET 111. Thus, it is possible to perform reflow soldering without damaging the FET.

Thus, as described above, the driving circuit of the high-voltage power supply device according to the third embodiment comprises the following: a piezoelectric transformer; a frequency-controlled oscillator; a switching element switchingly driven by an output signal from the frequency-controlled oscillator; and a capacitor and inductor forming a parallel resonance circuit so as to resonate owing to the switching operation of the switching element. The circuit further includes a capacitor connected across ground and the terminal on the side of the power supply connected to the inductor. The capacitance of the capacitor connected across ground and the terminal on the side of the power supply connected to the inductor is decided according to Equation (6).

As a result, it is possible to select a capacitance element (capacitor) and switching element best suited for the high-voltage power supply device according to this embodiment. In addition, reflow soldering can be performed while reliably preventing destruction of the switching element.

In accordance with the third embodiment, a capacitance element for reducing a rise in voltage due to the pyroelectric effect of a piezoelectric transformer is provided. Even when a board is subjected to reflow soldering, therefore, it is possible to reduce the voltage applied to the driving circuit components of the piezoelectric transformer. As a result, it is possible to reliably prevent the destruction of the components used. This leads to device reliability. Further, cost is reduced since solder-mounting is performed without a manual soldering operation and reliability of components after reflow mounting can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-327992, filed Dec. 19, 2007 and 2008-312494, filed Dec. 8, 2008, which are hereby incorporated by reference herein in their entirety.

What is claimed is:

1. A high-voltage power supply device comprising:
a circuit board having a piezoelectric transformer and a switching element,
wherein the circuit board comprises:
a capacitor and an inductor forming a resonance circuit for driving the piezoelectric transformer, and
a capacitance element connected across a ground and a power-supply side of the inductor,
wherein the capacitance element, the inductor and the piezoelectric transformer are arranged on the circuit board in such a manner that the piezoelectric transformer is solder-mounted after the capacitance element and the inductor are solder-mounted, and
wherein the capacitance element charges electric charge in accordance with a pyroelectric voltage produced in the piezoelectric transformer such that the electric charge in accordance with the pyroelectric voltage is reduced before the electric charge is applied to the switching element, when the circuit board on which the switching element, the capacitor, the inductor and the piezoelectric transformer are arranged is conveyed into a solder tank to solder the switching element, the capacitor, the inductor and the piezoelectric transformer to the circuit board.

2. The device according to claim 1, wherein if a capacitance of the capacitance element represents C2, then C2 satisfies the following condition:

$$C2 > Q/V - C0 - C1$$

where Q represents pyroelectric charge produced in the piezoelectric transformer when soldering is performed by the solder-mounting method, C0 represents parasitic capacitance on the primary side of the piezoelectric transformer, C1 represents capacitance of the capacitor and V represents a maximum rated voltage of the switching element connected to the primary side of the piezoelectric transformer.

3. An image forming apparatus having the high-voltage power supply device set forth in claim 1.

4. A high-voltage power supply device comprising:
a circuit board having a piezoelectric transformer and a switching element,
wherein the circuit board comprises:
an inductor for driving the piezoelectric transformer, and a capacitance element connected across a ground and a power-supply side of the inductor,
wherein the capacitance element, the inductor and the piezoelectric transformer are arranged on the circuit board in such a manner that the piezoelectric transformer is solder-mounted after the capacitance element and the inductor are solder-mounted, and
wherein the capacitance element charges electric charge in accordance with a pyroelectric voltage produced in the piezoelectric transformer such that the electric charge in accordance with the pyroelectric voltage is reduced before the electric charge is applied to the switching element, when the circuit board on which the switching element, the capacitor, the inductor and the piezoelectric transformer are arranged is conveyed into a solder tank to solder the switching element, the capacitor, the inductor and the piezoelectric transformer to the circuit board.

5. The device according to claim 4, wherein if a capacitance of the capacitance element represents C2, then C2 satisfies the following condition:

$$C2 > Q/V - C0$$

where Q represents pyroelectric charge produced in the piezoelectric transformer when soldering is performed by the solder-mounting method, C0 represents parasitic capacitance on the primary side of the piezoelectric transformer, and V represents a maximum rated voltage of the switching element connected to the primary side of the piezoelectric transformer.

6. An image forming apparatus having the high-voltage power supply device set forth in claim 4.

7. A circuit board on which an element that outputs high voltage is mounted, the circuit board comprising:
a piezoelectric transformer;
a switching element configured to drive the piezoelectric transformer;
a resonance circuit configured to drive the piezoelectric transformer, the resonance circuit having a capacitor and an inductor; and
a capacitance element connected across a ground and a power-supply side of the inductor,
wherein the capacitance element, the inductor and the piezoelectric transformer are arranged on the circuit board in such a manner that the piezoelectric transformer is solder-mounted after the capacitance element and the inductor are solder-mounted, and
wherein the capacitance element charges electric charge in accordance with a pyroelectric voltage produced in the piezoelectric transformer such that the electric charge in accordance with the pyroelectric voltage is reduced before the electric charge is applied to the switching element, when the circuit board on which the switching element, the capacitor, the inductor and the piezoelectric transformer are arranged is conveyed into a solder tank to solder the switching element, the capacitor, the inductor and the piezoelectric transformer to the circuit board.

8. The circuit board according to claim 7, wherein if a capacitance of the capacitance element represents C2, then C2 satisfies the following condition:

$$C2 > Q/V - C0 - C1$$

where Q represents pyroelectric charge produced in the piezoelectric transformer when soldering is performed by the solder-mounting method, C0 represents parasitic capacitance on the primary side of the piezoelectric transformer, C1 represents capacitance of the capacitor and V represents a maximum rated voltage of the switching element connected to the primary side of the piezoelectric transformer.

9. A circuit board on which an element that outputs high voltage is mounted, comprising:
a piezoelectric transformer;
a switching element configured to drive the piezoelectric transformer;
an inductor configured to drive the piezoelectric transformer; and
a capacitance element connected across a ground and a power-supply side of the inductor,
wherein the capacitance element, the inductor and the piezoelectric transformer are arranged on the circuit board in such a manner that the piezoelectric transformer is solder-mounted after the capacitance element and the inductor are solder-mounted, and
wherein the capacitance element charges electric charge in accordance with pyroelectric voltage produced in the piezoelectric transformer such that the electric charge in accordance with the pyroelectric voltage is reduced before the electric charge is applied to the switching element, when the circuit board on which the switching element, the capacitor, the inductor and the piezoelectric transformer are arranged is conveyed into a solder tank to solder the switching element, the capacitor, the inductor and the piezoelectric transformer to the circuit board.

10. The circuit board according to claim 9, wherein if a capacitance of the capacitance element represents C2, then C2 satisfies the following condition:

$$C2 > Q/V - C0$$

where Q represents pyroelectric charge produced in the piezoelectric transformer in a case that soldering is performed by the solder-mounting method, C0 represents parasitic capacitance on the primary side of the piezoelectric transformer, and V represents a maximum rated voltage of the switching element connected to the primary side of the piezoelectric transformer.

11. The device according to claim 1, wherein the circuit board further comprises:
a frequency-controlled oscillator configured to generate a frequency signal that drives the piezoelectric transformer; and
a switching element connected to a primary side of the piezoelectric transformer, configured to perform a switching operation in accordance with the frequency signal.

12. The device according to claim 4, wherein the circuit board further comprises:
a frequency-controlled oscillator configured to generate a frequency signal that drives the piezoelectric transformer; and
a switching element connected to a primary side of the piezoelectric transformer, configured to perform a switching operation in accordance with the frequency signal.

13. The circuit board according to claim 7, further comprising:
a frequency-controlled oscillator configured to generate a frequency signal that drives the piezoelectric transformer; and
a switching element connected to a primary side of the piezoelectric transformer, configured to perform a switching operation in accordance with the frequency signal.

14. The circuit board according to claim 9, further comprising:
a frequency-controlled oscillator configured to generate a frequency signal that drives the piezoelectric transformer; and
a switching element connected to a primary side of the piezoelectric transformer, configured to perform a switching operation in accordance with the frequency signal.

15. The device according to claim 1, wherein the pyroelectric voltage is reduced to be less than a rated voltage of the switching element.

16. The device according to claim 4, wherein the pyroelectric voltage is reduced to be less than a rated voltage of the switching element.

17. The board according to claim 7, wherein the pyroelectric voltage is reduced to be less than a rated voltage of the switching element 18. The board according to claim 9, wherein the pyroelectric voltage is reduced to be less than a rated voltage of the switching element.

19. A soldering method, comprising:
a conveyance step of conveying a circuit board on which a switching element, a capacitance element and a piezoelectric transformer are arranged into a solder tank; and
a soldering step of soldering the piezoelectric transformer to the circuit board after the capacitance element has been soldered to the circuit board,
wherein in the soldering step, the capacitance element is charged in accordance with a pyroelectric voltage produced in the piezoelectric transformer.

20. The soldering method according to claim 19, wherein the circuit board further comprises a capacitor and an inductor,
wherein in the soldering step, the capacitor and the inductor are soldered after the capacitance element has been soldered.

* * * * *